United States Patent
Jang et al.

(10) Patent No.: US 10,755,899 B2
(45) Date of Patent: Aug. 25, 2020

(54) SUBSTRATE TREATING APPARATUS

(71) Applicant: SEMES CO., LTD., Chungcheongnam-do (KR)

(72) Inventors: Yong Su Jang, Chungcheongnam-do (KR); Sun Rae Kim, Chungcheongnam-do (KR); Sung Hwan Hong, Chungcheongnam-do (KR)

(73) Assignee: SEMES CO., LTD., Chungcheo, Ngnam-Do (KR)

( * ) Notice: Subject to any disclaimer, the term of this patent is extended or adjusted under 35 U.S.C. 154(b) by 853 days.

(21) Appl. No.: 14/744,427

(22) Filed: Jun. 19, 2015

(65) Prior Publication Data
US 2015/0380216 A1    Dec. 31, 2015

(30) Foreign Application Priority Data
Jun. 30, 2014 (KR) .......................... 10-2014-0081160

(51) Int. Cl.
*H01J 37/32* (2006.01)

(52) U.S. Cl.
CPC .. *H01J 37/32192* (2013.01); *H01J 37/32477* (2013.01)

(58) Field of Classification Search
USPC ............. 118/723 MW, 723 ME; 156/345.35, 156/345.41
See application file for complete search history.

(56) References Cited

U.S. PATENT DOCUMENTS

| | | | |
|---|---|---|---|
| 2001/0032591 A1* | 10/2001 | Carducci | C23C 16/4412 118/723 E |
| 2003/0127049 A1* | 7/2003 | Han | C23C 16/4404 118/715 |
| 2005/0095732 A1* | 5/2005 | Maebashi | H01J 37/32082 438/17 |

(Continued)

FOREIGN PATENT DOCUMENTS

| | | |
|---|---|---|
| CN | 101627454 A | 1/2010 |
| CN | 102301451 A | 12/2011 |

(Continued)

OTHER PUBLICATIONS

Office Action for corresponding Chinese Application No. 201510370341.2 dated Sep. 26, 2016.

*Primary Examiner* — Rakesh K Dhingra
(74) *Attorney, Agent, or Firm* — Carter, DeLuca & Farrell LLP

(57) ABSTRACT

The inventive concepts provide a substrate treating apparatus. The apparatus includes a process chamber, a substrate support unit, a gas supply unit, a microwave applying unit, an antenna plate, a slow-wave plate, a dielectric plate, and an exhaust baffle, and a liner. The liner includes a body having a ring shape facing an inner sidewall of the process chamber, and a flange extending from the body into a wall portion of the process chamber. The flange prevents an electric field of a microwave and a process gas from being provided into a gap between the process chamber and the body. Thus, it is possible to inhibit particles from being generated by damage of the inner sidewall of the process chamber by plasma, and drift distances of the particles can be reduced to inhibit the particles from reaching a substrate.

5 Claims, 4 Drawing Sheets

(56) References Cited

U.S. PATENT DOCUMENTS

| | | | |
|---|---|---|---|
| 2006/0213444 A1* | 9/2006 | Samukawa | C23C 16/452 118/723 ME |
| 2007/0181145 A1* | 8/2007 | Ishizuka | B08B 7/0035 134/1.1 |
| 2008/0142159 A1* | 6/2008 | Sasaki | C23C 16/4404 156/345.41 |
| 2008/0295872 A1* | 12/2008 | Riker | H01J 37/32357 134/105 |
| 2009/0320756 A1* | 12/2009 | Tanaka | H01J 37/32192 118/723 MW |
| 2010/0050938 A1* | 3/2010 | Tetsuka | H01J 37/321 118/697 |
| 2011/0222038 A1* | 9/2011 | Yamashita | C23C 16/4581 355/53 |
| 2012/0067845 A1* | 3/2012 | Monden | H01J 37/32192 216/69 |
| 2012/0216955 A1* | 8/2012 | Eto | C23C 16/4404 156/345.51 |
| 2013/0105085 A1* | 5/2013 | Yousif | H01L 21/20 156/345.37 |
| 2014/0090783 A1 | 4/2014 | Kim et al. | |

FOREIGN PATENT DOCUMENTS

| | | |
|---|---|---|
| KR | 10-0463070 B1 | 12/2004 |
| KR | 2006-0003077 A | 1/2006 |
| KR | 2007-0020254 A | 2/2007 |
| KR | 2007-0053328 A | 5/2007 |
| KR | 20080074300 A | 8/2008 |
| KR | 2010-0122894 A | 11/2010 |
| KR | 20130122497 A | 11/2013 |
| KR | 20140014378 A | 2/2014 |
| KR | 20140042624 A | 4/2014 |

\* cited by examiner

SUBSTRATE TREATING APPARATUS

CROSS-REFERENCE TO RELATED APPLICATION

This U.S. non-provisional patent application claims priority under 35 U.S.C. § 119 to Korean Patent Application No. 10-2014-0081160, filed on Jun. 30, 2014, in the Korean Intellectual Property Office, the disclosure of which is hereby incorporated by reference in its entirety.

BACKGROUND

The inventive concepts relate to a substrate treating apparatus and, more particularly, to an apparatus for treating a substrate using plasma.

Plasma is generated by very high-temperature, a strong electric field, or a radio-frequency (RF) electromagnetic field. The plasma means an ionized gas state consisting of ions, electrons, and/or radicals. Various processes may be performed using the plasma when a semiconductor device is manufactured. For example, an etching process may be performed by colliding ion particles contained in the plasma with a substrate.

FIG. 1 is a cross-sectional view illustrating portions of a liner 2 and an inner sidewall 1 of a process chamber of a general substrate treating apparatus generating plasma by means of microwave. Referring to FIG. 1, a liner 2 is generally provided along an inner sidewall 1 of a process chamber in order to protect the inner sidewall 1 of the process chamber from plasma. However, a gap 3 may be formed between the inner sidewall 1 of the process chamber and the liner 2 by a machining tolerance, and an electric field 4 of microwave and a process gas 5 may be provided into the gap 3. Thus, the inner sidewall 1 of the process chamber may be damaged by the plasma to generate particles 6. In addition, drift distances of the particles 6 may increase by the flow of the process gas 5 provided to the gap 3, so the particles 6 may reach a substrate.

SUMMARY

Embodiments of the inventive concepts may provide an apparatus capable of protecting an inner sidewall of a process chamber to inhibit generation of particles.

Embodiments of the inventive concepts may also provide an apparatus capable of reducing a drift distance of a particle to prevent contamination of a substrate.

In an aspect, a substrate treating apparatus includes a process chamber having a treatment space defined therein, a substrate support unit supporting a substrate in the process chamber, a gas supply unit supplying a process gas into the process chamber, a dielectric plate provided as a top wall of the treatment space, an antenna plate disposed on the dielectric plate, a microwave applying unit applying a microwave to the antenna plate, and a liner installed on an inner sidewall of the process chamber. The liner includes a body having a ring shape facing the inner sidewall of the process chamber, and a flange extending from an outer sidewall of the body into a wall portion of the process chamber.

In an embodiment, the flange may include a plurality of flanges vertically spaced apart from each other.

In an embodiment, the flange may be provided on an outer sidewall of a top end portion of the liner.

In an embodiment, a surface of the flange may be formed of a dielectric material.

In an embodiment, the flange may include a base formed of a metal material, and a dielectric layer coated on a surface of the base.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
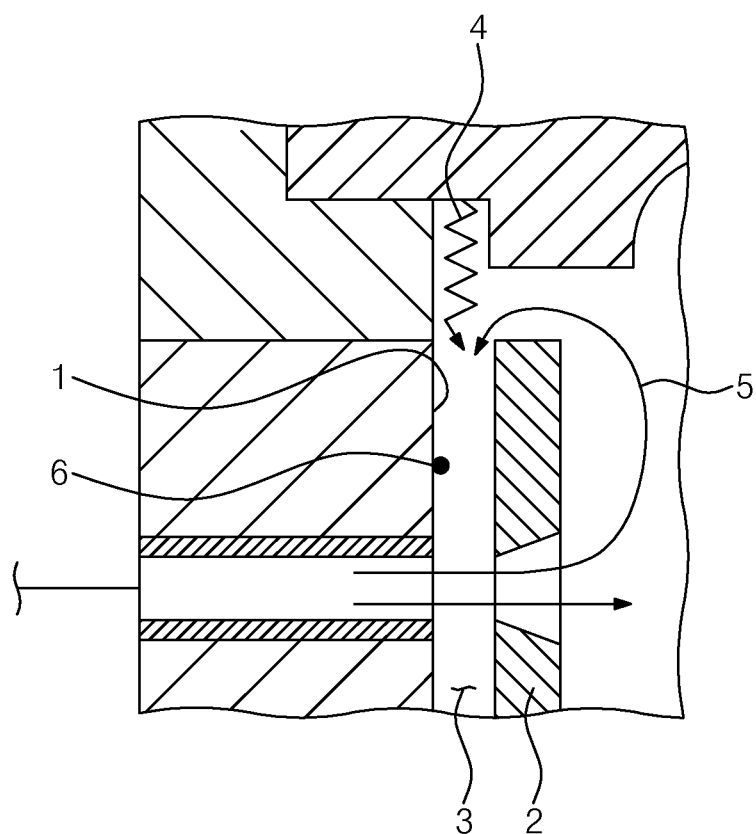
FIG. 1 is a cross-sectional view illustrating portions of a liner and an inner sidewall of a process chamber of a general substrate treating apparatus.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 2:
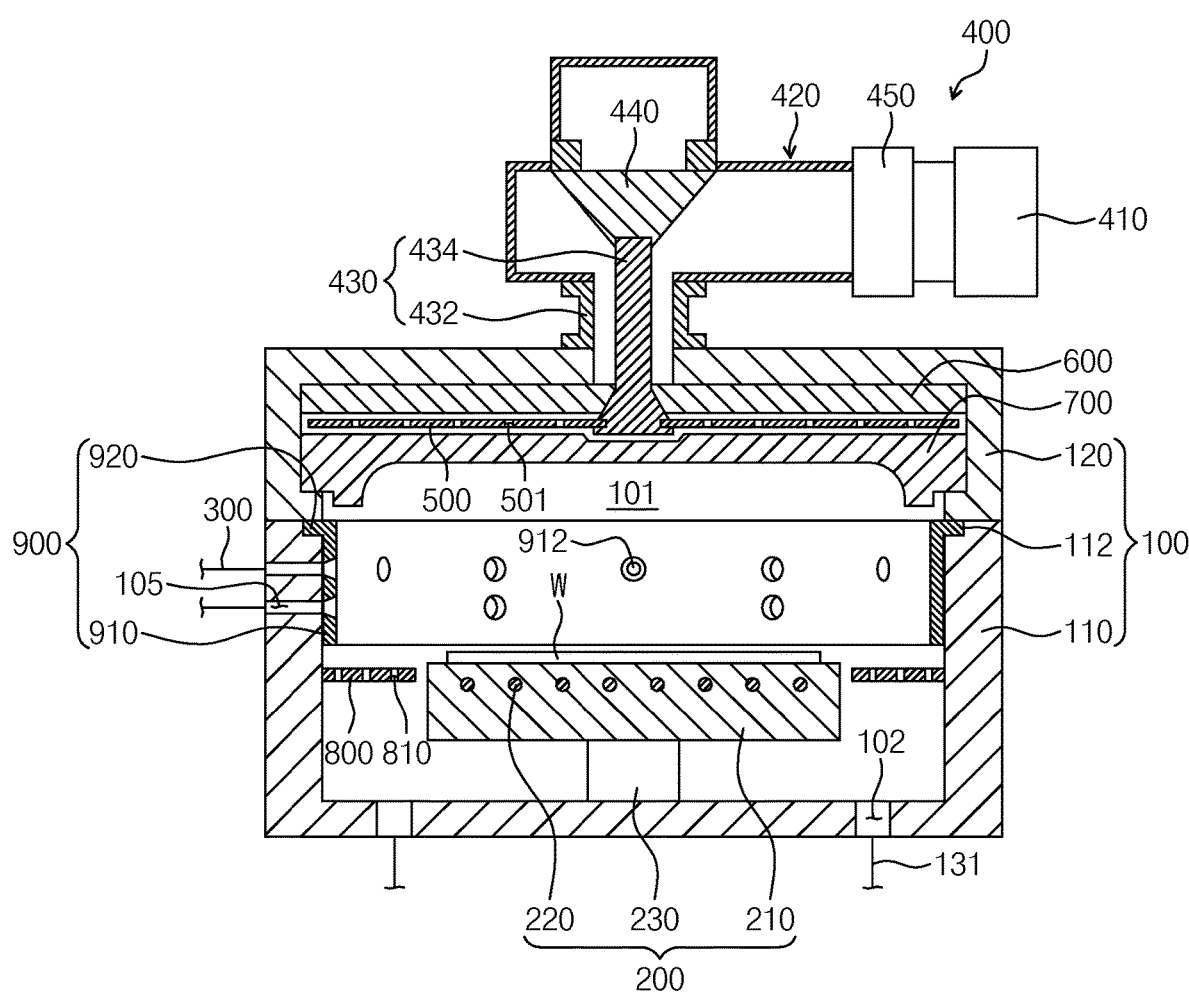
FIG. 2 is a cross-sectional view illustrating a substrate treating apparatus according to example embodiments of the inventive concepts.

FIG. 2 is a cross-sectional view illustrating a substrate treating apparatus according to example embodiments of the inventive concepts.

Referring to FIG. 2, a substrate treating apparatus 10 performs a plasma process treatment on a substrate W. The substrate treating apparatus 10 includes a process chamber 100, a substrate support unit 200, a gas supply unit 300, a microwave applying unit 400, an antenna plate 500, a slow-wave plate 600, a dielectric plate 700, and a liner 900.

The process chamber 100 includes a treatment space 101 therein, and the treatment space 101 is provided as a space in which a process of treating the substrate W is performed. The process chamber 100 includes a body 110 and a cover 120.

A top end of the body 110 is opened, and a space is formed in the body 110. A groove 112 into which a flange 920 is inserted may be formed in an inner sidewall of the body 110.

The cover 120 is disposed on the body 110 to seal the opened top end of the body 110. An inner sidewall of a bottom end portion of the cover 120 is stepped such that a radius of an upper space surrounded by the cover 120 is greater than that of a lower space surrounded by the cover 120.

A substrate inlet (not shown) may be formed in one sidewall of the process chamber 100. The substrate inlet (not shown) is provided as a path through which the substrate W is loaded and/or unloaded into and/or from the process chamber 100. The substrate inlet (not shown) is opened and closed by an opening and closing member such as a door.

An exhaust hole 102 is formed in a bottom plate of the process chamber 100. The exhaust hole 102 is connected to an exhaust line 131. The inside of the process chamber 100 is maintained at pressure lower than atmospheric pressure by exhaust through the exhaust line 131. In addition, reaction byproducts and a residual gas which are generated during the process may be exhausted to the outside of the process chamber 100 through the exhaust line 131.

The substrate support unit 200 is disposed within the process chamber 100 and supports the substrate W. The substrate support unit 200 includes a support plate 210, a lift pin (not shown), a heater 220, and a support axis 230.

The support plate 210 has a predetermined thickness and a circular plate shape having a radius greater than that of the substrate W. A substrate-providing depressed region in which the substrate W is placed may be formed in a top surface of the support plate 210. In some embodiments, a member fixing the substrate W may not be provided to the support plate 210, and the process may be performed in the state that the substrate W is placed on the support plate 210. Alternatively, the support plate 210 may be an electrostatic chuck fixing the substrate W by means of electrostatic force or a chuck fixing the substrate W by a mechanical clamping method.

The lift pin may be provided in plurality, and the plurality of lift pins may be respectively disposed in pin holes (not shown) formed in the support plate 210. The lift pins may be movable along the pin holes in up and down directions and may load or unload the substrate W onto or from the support plate 210.

The heater 220 is provided within the support plate 210. The heater 220 may include a spiral-shaped coil and may be buried within the support plate 210 by equal distances. The heater 220 may be connected to an external power source (not shown) and may generate heat by a current supplied from the external power source. The generated heat may be transmitted to the substrate W through the support plate 210 to heat the substrate W to a predetermined temperature.

The support axis 230 is disposed under the support plate 210 and supports the support plate 210. The support plate 210 may be configured to be movable in up and down directions by a driving member (not shown).

The gas supply unit 300 supplies a process gas into the process chamber 100. The gas supply unit 300 may supply the process gas into the process chamber 100 through a gas supply hole 105 formed in the sidewall of the process chamber 100. The gas supply hole 105 may be provided in plurality.

The microwave applying unit 400 applies a microwave to the antenna plate 500. The microwave applying unit 400 includes a microwave generator 410, a first waveguide 420, a second waveguide 430, a phase converter 440, and a matching network 450.

The microwave generator 410 generates the microwave.

The first waveguide 420 is connected to the microwave generator 410 and has a path formed therein. The microwave generated from the microwave generator 410 is transmitted toward the phase converter 440 along the first waveguide 420.

The second waveguide 430 includes an external conductor 432 and an internal conductor 434.

The external conductor 432 extends downward from an end of the first waveguide 420 in a vertical direction, and a path is formed within the external conductor 432. A top end of the external conductor 432 is connected to a bottom end of the first waveguide 420, and a bottom end of the external conductor 432 is connected to a top end of the cover 120.

The internal conductor 434 is disposed within the external conductor 432. The internal conductor 434 is provided as a cylinder-shaped rod, and a longitudinal direction of the internal conductor 434 is parallel to the vertical direction. A top end of the internal conductor 434 is inserted into and fixed in a bottom end portion of the phase converter 440. The internal conductor 434 extends downward, so a bottom end of the internal conductor 434 is disposed in the process chamber 100. The bottom end of the internal conductor 434 is fixed and connected to a center of the antenna plate 500. The internal conductor 434 is disposed to be vertical to a top surface of the antenna plate 500. The internal conductor 434 may be a copper rod on which a first plating layer and a second plating layer are sequentially coated. In an embodiment, the first plating layer may be formed of nickel (Ni), and the second plating layer may be formed of gold (Au). The microwave is mainly transmitted to the antenna plate 500 through the first plating layer.

The microwave, a phase of which is converted in the phase converter 440, is transmitted toward the antenna plate 500 through the second waveguide 430.

The phase converter 440 may be provided at a spot at which the first and second waveguides 420 and 430 are connected to each other. The phase converter 440 converts a phase of the microwave. The phase converter 440 may have a cone shape that is tapered down. The phase converter 440 may convert a mode of the microwave transmitted from the first waveguide 420 and may transmit the microwave of the converted mode to the second waveguide 430. The phase converter 440 may convert the mode of the microwave from a TE mode to a TEM mode.

The matching network 450 is provided to the first waveguide 420. The matching network 450 may match a frequency of the microwave transmitted through the first waveguide 420 to a predetermined frequency.

Figure 3:
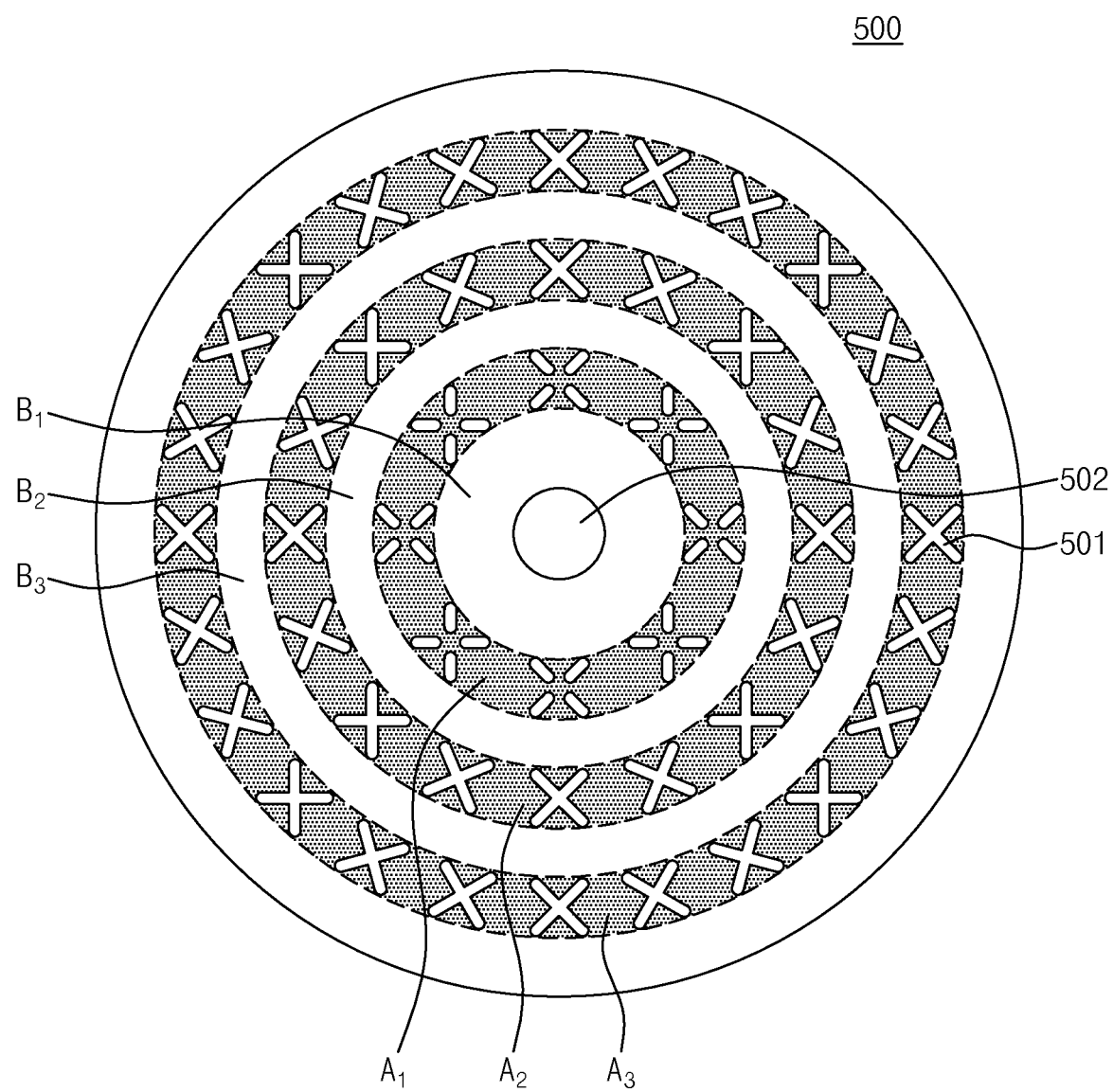
FIG. 3 is a bottom view illustrating a bottom surface of an antenna plate of FIG. 2.

FIG. 3 is a bottom view illustrating a bottom surface of an antenna plate of FIG. 2. Referring to FIGS. 2 and 3, the antenna plate 500 has a plate shape. For example, the antenna plate 500 may have a thin circular plate shape. The antenna plate 500 is disposed to face the support plate 210. A plurality of slots 501 are formed in the antenna plate 500. The slots 501 may be X-shaped. Alternatively, the shapes and arrangement of the slots 501 may be variously modified. The plurality of slots 501 may be arranged in a plurality of ring shapes. Hereinafter, a region of the antenna plate 500 in which the slots 501 are formed are defined as a first region A1, A2, or A3, and a region of the antenna plate 500 in which the slots 501 are not formed are defined as a second region B1, B2, or B3. Each of the first and second regions A1, A2, A3, B1, B2, and B3 has a ring shape. The first region is provided in plurality, and the plurality of first regions A1, A2, and A3 have different radiuses from each other. The first regions A1, A2, and A3 have the same center and are spaced apart from each other in a radius direction of the antenna plate 500. The second region is provided in plurality, and the plurality of second regions B1, B2, and B3 have different radiuses from each other. The second regions B1, B2, and B3 have the same center and are spaced apart from each other in the radius direction of the antenna plate 500. Each of the first regions A1, A2, and A3 may be disposed between the second regions adjacent to each other. In other words, the second regions B1, B2, and B3 and the first regions A1, A2, A3 may be alternately arranged along the radius direction of the antenna plate 500. A hole 502 is formed in a central portion of the antenna plate 500. The bottom end of the internal conductor 434 penetrates the hole 502 so as to be connected to the antenna plate 500. The microwave is transmitted to the dielectric plate 700 through the slots 501.

Referring again to FIG. 2, the slow-wave plate 600 is disposed on the antenna plate 500 and has a circular plate shape having a predetermined thickness. The slow-wave plate 600 may have a radius corresponding to a radius of the inside of the cover 120. The slow-wave plate 600 may be formed of a dielectric such as alumina or quartz. The microwave transmitted in the vertical direction through the internal conductor 434 is transmitted in a radius direction of the slow-wave plate 600. A wavelength of the microwave transmitted to the slow-wave plate 600 is compressed, and the microwave of the slow-wave plate 600 resonates.

The dielectric plate 700 is disposed under the antenna plate 500 and has a circuit plate shape having a predetermined thickness. The dielectric plate 700 may be formed of a dielectric such as alumina or quartz. A bottom surface of the dielectric plate 700 may include a concave surface curving in the dielectric plate 700. The bottom surface of the dielectric plate 700 may be disposed at the same height as the bottom end of the cover 120 or at the higher position than the bottom end of the cover 120. An outer sidewall of the dielectric plate 700 may be stepped such that a radius of a top end of the sidewall of the dielectric plate 700 is greater than that of a bottom end of the sidewall of the dielectric plate 700. An edge of the dielectric plate 700 is disposed on the stepped bottom end portion of the cover 120. A bottom end of the dielectric plate 700 has a radius smaller than that of the bottom end portion of the cover 120 and is spaced apart from the bottom end portion of the cover 120 by a predetermined distance. The microwave is irradiated into the process chamber 100 through the dielectric plate 700. The process gas supplied in the process chamber 100 is excited to a plasma state by an electric field of the irradiated microwave. In some embodiments, the slow-wave plate 600, the antenna plate 500, and the dielectric plate 700 may adhere closely to each other.

An exhaust baffle 800 may be a ring-shaped plate. Exhaust holes 810 may be vertically formed in an outer region of the exhaust baffle 800. The exhaust baffle 800 may be fixed on an inner sidewall of the process chamber 100 to surround the substrate support unit 200. The substrate support unit 200 may penetrate a central portion of the exhaust baffle 800 so as to be movable in up and down directions.

Figure 4:
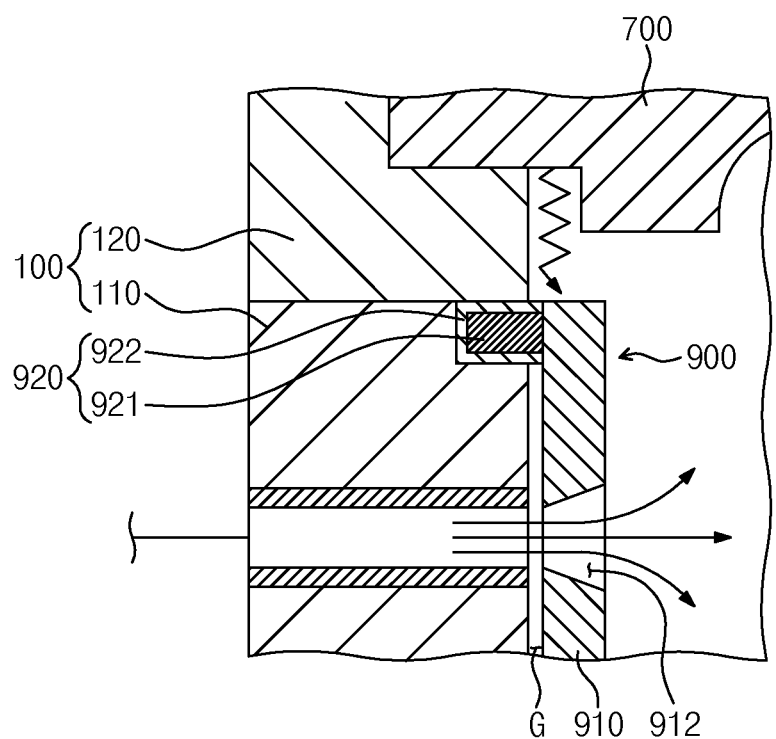
FIG. 4 is a cross-sectional view illustrating portions of a liner and an inner sidewall of a process chamber of FIG. 2.

FIG. 4 is a cross-sectional view illustrating portions of the liner 900 and an inner sidewall of the process chamber 100 of FIG. 2. Referring to FIGS. 2 and 4, the liner 900 is installed on the inner sidewall of the process chamber 100. The liner 900 can prevent the inner sidewall of the process chamber 100 from being damaged by the plasma. The liner 900 includes a body 910 and the flange 920.

The body 910 has a ring shape facing the inner sidewall of the process chamber 100. A through-hole 912 penetrates the body 910 to face each of the gas supply holes 105. The process gas jetting from the gas supply hole 105 flows into the process chamber 100 through the through-hole 912. A gap G may be formed between the process chamber 100 and the body 910 by a machining tolerance. If an electric field of the microwave and the process gas are provided into the gap G, the inner sidewall of the process chamber 100 may be damaged by the plasma to generate particles. In addition, drift distances of the particles may increase by the flow of the process gas provided into the gap G, so the particles may reach the substrate W.

The flange 920 extends from an outer sidewall of the body 910 into a wall portion of the process chamber 100. The flange 920 has a ring shape surrounding a circumference of the body 910. The flange 920 may be provided on an outer sidewall of a top end portion of the liner 900. Alternatively, the flange 920 may be provided on an outer sidewall of a bottom end portion of the liner 900 or a portion, between the top and bottom end portions, of the liner 900. One flange 920 is illustrated as an example in FIGS. 2 and 4. Alternatively, the flange 920 may include a plurality of flanges vertically spaced apart from each other.

A surface of the flange 920 is formed of a dielectric material. An inner portion of the flange 920 may be formed of a metal material or a dielectric material. For example, the flange 920 may include a base 921 and a dielectric layer 922. The base 921 may be formed of a metal material, and the dielectric layer 922 may be formed of a dielectric material coated on a surface of the base 921. The flange 920 may prevent the electric field of the microwave and the process gas from flowing into the gap G. Thus, it is possible to inhibit the generation of the particles by the damage of the inner sidewall of the process chamber 100 by plasma, and drift distances of the particles can be reduced to inhibit the particles from reaching the substrate W.

According to embodiments of the inventive concepts, the inner sidewall of the process chamber may be protected to inhibit generation of the particles.

According to embodiments of the inventive concepts, the drift distances of the particles may be reduced to prevent contamination of the substrate.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A substrate treating apparatus comprising:
a process chamber including a body having an open top end and a cover sealed about the open top end of the body to define a treatment space within the process chamber, wherein the body forms a plurality of gas supply holes through a vertical side of the body;
a substrate supporter configured to support a substrate in the process chamber; a gas supplier configured to supply a process gas into the process chamber via the plurality of gas supply holes;
a dielectric plate provided as a top wall of the treatment space;
an antenna plate disposed on the dielectric plate;
a microwave applicator configured to apply a microwave to the antenna plate; and a liner installed on an inner sidewall of the process chamber, wherein the liner comprises:
a body having a ring shape facing the inner sidewall of the process chamber, forming a vertical gap between the inner sidewall and the body of the liner; and
a flange extending outward from an outer sidewall of the body of the liner into a wall portion of the process chamber such that the flange abuts and extends at least partially between the body of the liner and the cover of the process chamber and blocks the vertical gap,
wherein the flange comprises:
a base formed of a metal material; and
a dielectric layer coated on the base to define the surface of the flange formed of the dielectric material, wherein the dielectric layer surrounds the base, and
wherein the liner forms a plurality of through holes there-through, each of which faces a corresponding one of the plurality of gas supply holes.

2. The substrate treating apparatus of claim 1, wherein the flange is provided on an outer sidewall of a top end portion of the liner.

3. The substrate treating apparatus of claim 1, wherein the process gas is supplied via the plurality of through holes through the inner sidewall and the body of the liner.

4. The substrate treating apparatus of claim 1, wherein the flange provides an outer sidewall of a top end portion of the liner.

5. The substrate treating apparatus of claim 1, wherein the flange prevents the microwave from the vertical gap.

* * * * *